United States Patent
Bae et al.

(10) Patent No.: US 10,622,885 B2
(45) Date of Patent: Apr. 14, 2020

(54) METHOD FOR CONTROLLING INVERTER

(71) Applicant: LSIS CO., LTD., Anyang-si, Gyeonggi-do (KR)

(72) Inventors: Tae-Suk Bae, Anyang-si (KR); Deok-Young Lim, Anyang-si (KR); Hu-Jin Lee, Anyang-si (KR); Chun-Suk Yang, Anyang-si (KR)

(73) Assignee: LSIS CO., LTD., Anyang-si, Gyeonggi-Do (KR)

( * ) Notice: Subject to any disclaimer, the term of this patent is extended or adjusted under 35 U.S.C. 154(b) by 0 days.

(21) Appl. No.: 16/282,887

(22) Filed: Feb. 22, 2019

(65) Prior Publication Data
US 2019/0348905 A1    Nov. 14, 2019

(30) Foreign Application Priority Data

May 9, 2018 (KR) ........................ 10-2018-0052889

(51) Int. Cl.
*H02M 1/32* (2007.01)
*H05K 7/20* (2006.01)
*G05F 1/573* (2006.01)

(52) U.S. Cl.
CPC .......... *H02M 1/32* (2013.01); *H05K 7/20909* (2013.01); *G05F 1/573* (2013.01); *H02M 2001/327* (2013.01)

(58) Field of Classification Search
CPC ......................... H02M 2001/327; G05F 1/573
USPC .............................. 323/277; 363/56.03, 56.1
See application file for complete search history.

(56) References Cited

U.S. PATENT DOCUMENTS

| | | | |
|---|---|---|---|
| 2013/0294111 A1 | 11/2013 | Persson et al. | |
| 2015/0107934 A1 | 4/2015 | Morino | |
| 2015/0145462 A1* | 5/2015 | Ulrich | H02M 5/458 318/503 |
| 2015/0364985 A1* | 12/2015 | Lee | H02M 5/458 363/37 |
| 2015/0366104 A1* | 12/2015 | Lim | H05K 7/20209 700/282 |
| 2015/0369145 A1* | 12/2015 | Hoban, Jr. | H02M 3/156 701/102 |

FOREIGN PATENT DOCUMENTS

| KR | 20150110173 A | 10/2015 |
|---|---|---|
| KR | 20170121626 A | 11/2017 |

OTHER PUBLICATIONS

European Search Report for related European Application No. 19158100.8; action dated Jul. 29, 2019; (9 pages).

* cited by examiner

*Primary Examiner* — Gary A Nash
(74) *Attorney, Agent, or Firm* — K&L Gates LLP

(57) ABSTRACT

The present invention relates to a method for controlling an inverter to prevent an unnecessary fan trip. The method includes: receiving a fan current; when the fan current is above a high trip level or is below a low trip level, incrementing an error count; when the error count reaches an error count maximum value, incrementing a trip count and initializing the error count; and when the trip count reaches a trip count maximum value, generating a fan trip signal.

7 Claims, 7 Drawing Sheets

METHOD FOR CONTROLLING INVERTER

CROSS-REFERENCE TO RELATED APPLICATION

Pursuant to 35 U.S.C. § 119(a), this application claims the benefit of earlier filing date and right of priority to Korean Application No. 10-2018-0052889, filed on May 9, 2018, which is herein expressly incorporated by reference in its entirety.

TECHNICAL FIELD

The present disclosure relates to a method for controlling an inverter.

BACKGROUND

Generally, an inverter is an inverse conversion device that electrically converts DC to AC. An inverter used in the industry is defined as a series of devices that control the motor speed to be used with high efficiency by receiving the power supplied from the commercial power supply and varying the voltage and frequency by itself and supplying the varied power to the motor. Such inverter is used in various forms throughout the industrial field including fans, pumps, elevators, transport devices, and production lines.

Inverters include heat emission elements such as high-frequency switching elements such as insulated gate bipolar transistors (IGBTs), or metal oxide semi-conductor field effect transistors MOSFETs, and high-capacity capacitors. A cooling device, such as the fan for cooling the exothermic component is essential to ensure the life of the inverter and provide reliability.

When a problem occurs with this cooling device, an inverter controller detects the failure of the cooling device. When a trip occurs, the controller may stop of supply of a pulse width modulation to the inverter and stops the inverter operation. However, since the operation of the inverter stops due to the detection of the failure of the cooling device in an inappropriate state, the reliability of the inverter system is deteriorated.

SUMMARY

In order to solve the problem, a purpose of the present disclosure is to provide an inverter-controlling method which improves the reliability of an inverter by preventing an unnecessary fan trip from occurring in an instantaneous fan overload situation.

The purpose of the present disclosure is not limited to the above-mentioned purposes. Other purposes and advantages of the present disclosure that are not mentioned may be understood by following descriptions, and will be more clearly understood by embodiments of the present disclosure. It is to be further understood that the purposes and advantages of the present disclosure may be realized and attained by means of means and combinations thereof recited in the appended claims.

In one aspect of the present disclosure, there is provided a method for controlling an inverter to prevent an unnecessary fan trip, the method comprising: receiving a fan current; when the fan current is above a high trip level or is below a low trip level, incrementing an error count; when the error count reaches an error count maximum value, incrementing a trip count and initializing the error count; and when the trip count reaches a trip count maximum value, generating a fan trip signal.

In one implementation, incrementing the error count includes incrementing the error count up while maintaining a none error count.

In one implementation, the method further comprises: when the fan current is between the low trip level and the high trip level, incrementing the none error count; and when the none error count reaches a none error count maximum value, initializing the trip count.

In one implementation, incrementing the none error count includes incrementing the none error count while maintaining the error count.

In one implementation, initializing the trip count includes initializing both the error count and the none error count.

In one implementation, the method further comprises: receiving temperature information about a temperature in the inverter; when the temperature in the inverter is higher than or equal to a first temperature, incrementing the trip count; and when the trip count exceeds a first maximum value, generating a fan trip signal.

In one implementation, the method further comprises: when the temperature in the inverter is lower than the first temperature and is higher than or equal to a second temperature lower than the first temperature, incrementing the trip count; and when the trip count exceeds a second maximum value greater than the first maximum value, generating a fan trip signal.

According to the present disclosure, when the fan current drifts out of the normal range at a beginning of operation of the fan but operates within the normal range after a certain period of time from the beginning, the fan trip signal is not generated rapidly, such that the reliability of the inverter can be improved.

In addition, the present disclosure may improve the reliability of the inverter by determining whether to generate the trip signal in consideration of not only the fan current but also the inverter temperature information. Thus, the customer satisfaction can be improved.

Further specific effects of the present disclosure as well as the effects as described above will be described in conduction with illustrations of specific details for carrying out the invention.

DETAILED DESCRIPTION

Figure 1:
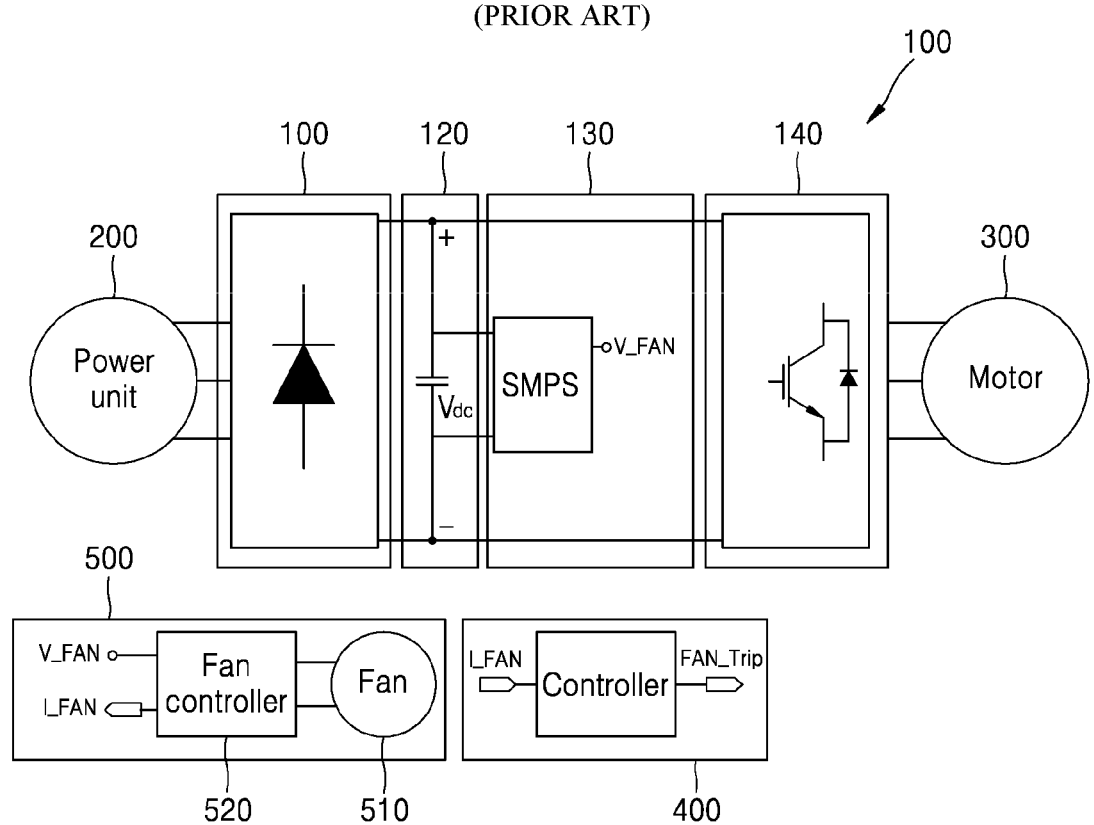
FIG. 1 shows a configuration of a conventional inverter system.

Hereinafter, a method for controlling an inverter in accordance with the present disclosure will be described with reference to the accompanying drawings.

For simplicity and clarity of illustration, elements in the figures. are not necessarily drawn to scale. The same reference numbers in different figures. denote the same or similar elements, and as such perform similar functionality. Also, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

The above objects, features and advantages will become apparent from the detailed description with reference to the accompanying drawings. Embodiments are described in sufficient detail to enable those skilled in the art in the art to easily practice the technical idea of the present disclosure. Detailed descriptions of well-known functions or configurations may be omitted in order not to unnecessarily obscure the gist of the present disclosure. Hereinafter, embodiments of the present disclosure will be described in detail with reference to the accompanying drawings. Throughout the drawings, like reference numerals refer to like elements.

Unless defined otherwise, all terms used herein have the same meaning as commonly understood by one of ordinary skill in the art. When the terms used herein are in conflict with a general meaning of the term, the meaning of the term is in accordance with a definition used herein.

Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

In addition, it will also be understood that when a first element or layer is referred to as being present "on" a second element or layer, the first element may be disposed directly on the second element or may be disposed indirectly on the second element with a third element or layer being disposed between the first and second elements or layers. It will be understood that when an element or layer is referred to as being "connected to", or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

Hereinafter, a conventional inverter-controlling method will be described with reference to FIGS. 1 to 3. An inverter-controlling method in accordance with one embodiment of the present disclosure will be described with reference to FIGS. 4 to 8.

FIG. 1 shows a configuration of a conventional inverter system.

When an AC power is supplied from a power unit 200, a rectifying module 110 of an inverter 100 rectifies the AC power to a DC power. Thus, a DC link capacitor 120 is charged with the DC link voltage. A controller 400 provides a pulse width modulation (PMW) signal to the inverting module 140. The inverting module 140 converts the DC link voltage to an AC voltage via the PWM signal and outputs the converted AC voltage to a motor 300.

A switched mode power supply (SMPS) 130 starts to operate, via the DC link voltage, and, a fan voltage V_FAN for operating a cooling device is provided from the SMPS 130 to the cooling device 500. The fan 510 of the cooling device 500 receives the fan voltage V_FAN and starts its operation. A fan controller 520 detects a fan current I_FAN and transfers the detected current to the controller 400. When a failure condition of the fan 510 occurs, the controller 400 outputs a fan trip signal FAN_Trip to stop the operation of the inverter 100.

Figure 2:
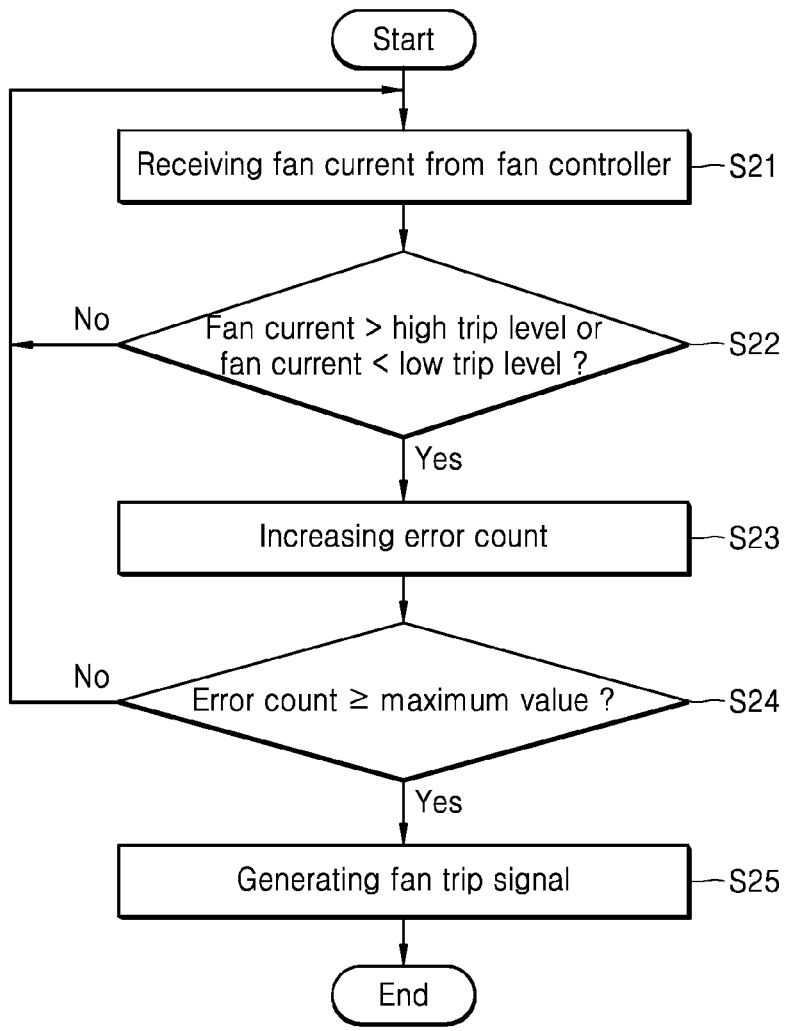
FIG. 2 is a flow chart for describing an operation of a controller in the conventional inverter system as shown in FIG. 1.
Figure 3:
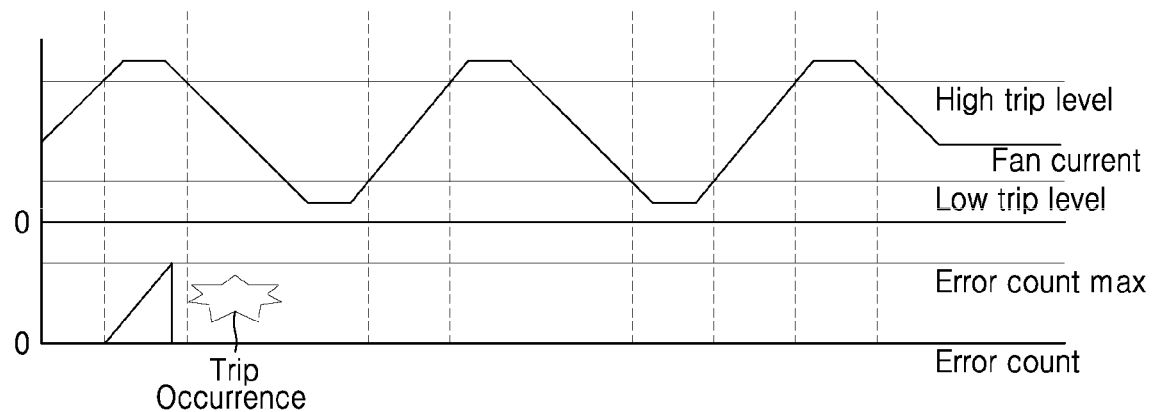
FIG. 3 is an example diagram for describing fan current and fan trip signal generation.

FIG. 2 is a flow chart for describing an operation of the controller in the conventional inverter system as shown in FIG. 1. FIG. 3 is an example diagram for describing fan current and fan trip signal generation.

A level of the fan current at which a trip occur when the fan current is maintained above a certain level by setting is referred to as a 'high trip level' of the fan current. A level of the fan current at which a trip occurs when the fan current is maintained below a certain level is referred to as a 'low trip level' of the fan current. Those are shown in FIG. 3.

Referring to FIG. 2, the controller 400 receives the fan current detected by the fan controller 520 S21 and determines whether the fan current exceeds the high trip level or is lower than the low trip level S22. If so, the controller 400 increases an error count S23.

Then, when the error count is equal to or greater than a maximum value S24, the controller 400 generates a fan trip signal S25. When the fan trip signal occurs, the supply of the PWM signal to the inverter module 140 stops, thereby stopping the operation of the inverter 100.

The reason why the fan trip signal is generated in this manner is to prevent the inverter 100 from overheating. When the fan trip signal is generated, the power supply to the inverter 100 is not cut off. An operation of the motor 300 stops.

However, since the conventional fan control method as described above determines the trip using only the fan current. Thus, in a case where the inverter 100 is initially operated after being left at a low temperature for a long time, the fan 510 operates normally but the fan current intermittently rises due to an increase in a frictional force of the blade of the fan 510, resulting in the fan trip. Alternatively, when dusts or the like instantaneously flows into the fan 510 and thus the fan current suddenly rises, there is a problem that the fan trip may occur although a temperature of the inverter 100 itself does not rise.

When the fan trip occurs due to factors other than the temperature increase of the inverter 100 itself, the operation of the inverter 100 is stopped and the operation of the motor 300 is stopped. Thus, the task that the user is being involved is forcibly stopped, resulting in a temporal and economical loss. This leads to a problem that the reliability of the product is lowered.

Therefore, it is necessary to generate the trip only when the temperature of the inverter 100 rises excessively due to a fault in the inverter 100.

The present disclosure is intended to solve such a problem and thus provides an inverter cooling device-controlling method which improves the reliability of the inverter by preventing the occurrence of an unnecessary fan trip in a momentary fan overload situation.

Figure 4:
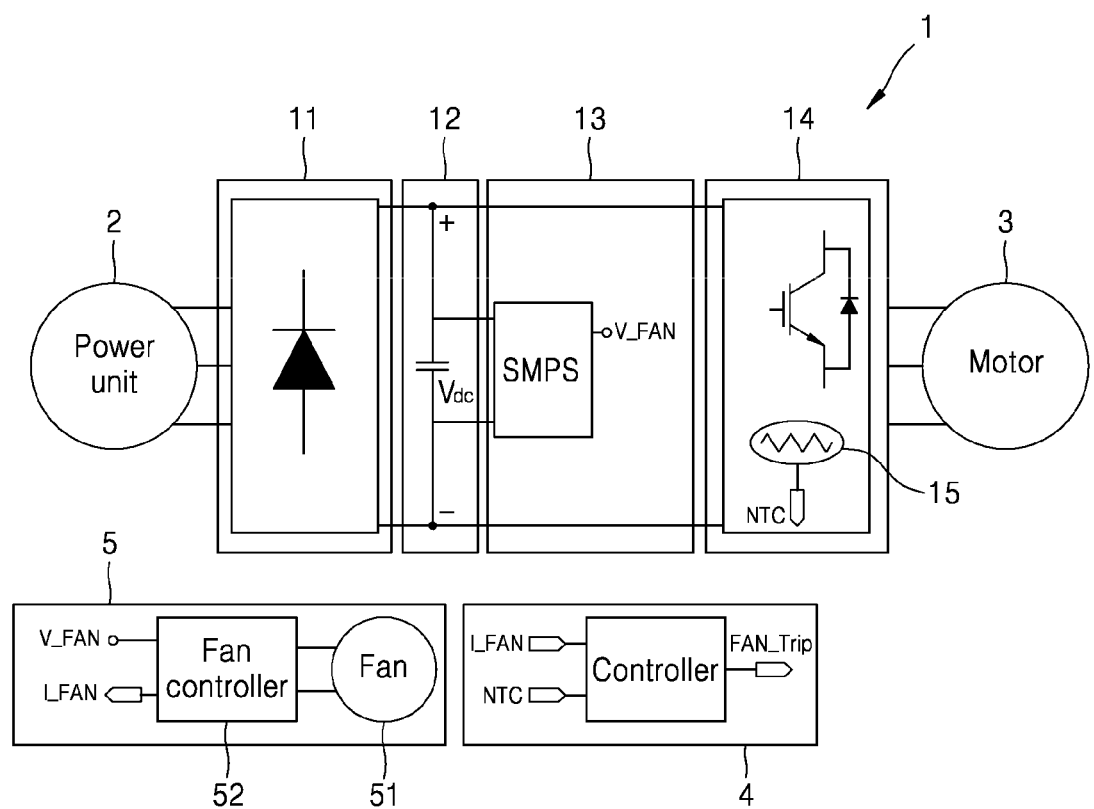
FIG. 4 is a configuration diagram of an inverter system to which one embodiment of the present disclosure is applied.

FIG. 4 is a configuration diagram of an inverter system to which one embodiment of the present disclosure is applied.

As shown in FIG. 4, the system to which the present disclosure is applied includes an inverter 1 for converting an AC voltage applied from the power unit 2 into a voltage having a predetermined magnitude and a frequency, and providing the converted voltage to the motor 3; a controller 4 which provides a pulse width modulation PWM signal and a trip signal to the inverter 1, and a cooling device 5 for cooling the inverter 1.

The inverter 1 includes a rectifying module 11 for converting an AC voltage input from the power unit 2 into a DC voltage, a DC link capacitor 12 for storing the DC voltage from the rectifying module 11, a DC power supply 13 for supplying the DC voltage stored in the DC link capacitor 12 to the cooling device 5 as a power source, an inverting module 14 composed of semiconductor switching elements such insulated gate bipolar mode transistors (IGBTs) wherein the inverting module 14 uses the PWM signal from the controller 4 to convert the DC link voltage into an AC voltage and outputs the AC voltage to the motor, and a temperature detection module 15 for detecting a temperature of the inverting module 14.

The DC power supply 13 may be, but is not limited to, a switched mode power supply SMPS. Various types of power supply devices may be used that provide the DC link voltage stored in the DC link capacitor 12 as a power source to other components.

The temperature detection module 15 is disposed inside the inverting module 14 because an element that generates most of the heat in the inverter 1 is the switching elements of the inverting module 14. However, the present disclosure may not be limited thereto. The temperature detection module 15 may be disposed at various positions where the internal temperature of the inverter 1 may be appropriately measured. The temperature detection module 15 may be, for example, an NCT (Negative Temperature Coefficient of Resistance) temperature sensor. Temperature information NTC about a temperature inside the inverter 1 detected by the temperature detection module 15 may be transmitted to the controller 4.

The cooling device 5 may include a fan 51 and a fan controller 52. However, in one embodiment of the present disclosure, the fan 51 is used as an example of the cooling device 5, but is not limited thereto. The present disclosure does not exclude the use of various types of cooling devices.

When the DC link capacitor 12 is charged with the DC link voltage, this allows the DC power supply 13 to start operating. The DC power supply 13 provides the fan voltage V_FAN for operating the cooling device 5 to the fan controller 52 of the cooling device 5. The fan 51 may be supplied with the fan voltage V_FAN from the fan controller 52 and may start the operation of the fan. The fan controller 2 may detect the fan current I_FAN of the fan 51 and provide the detected fan current to the controller 4.

Figure 5:
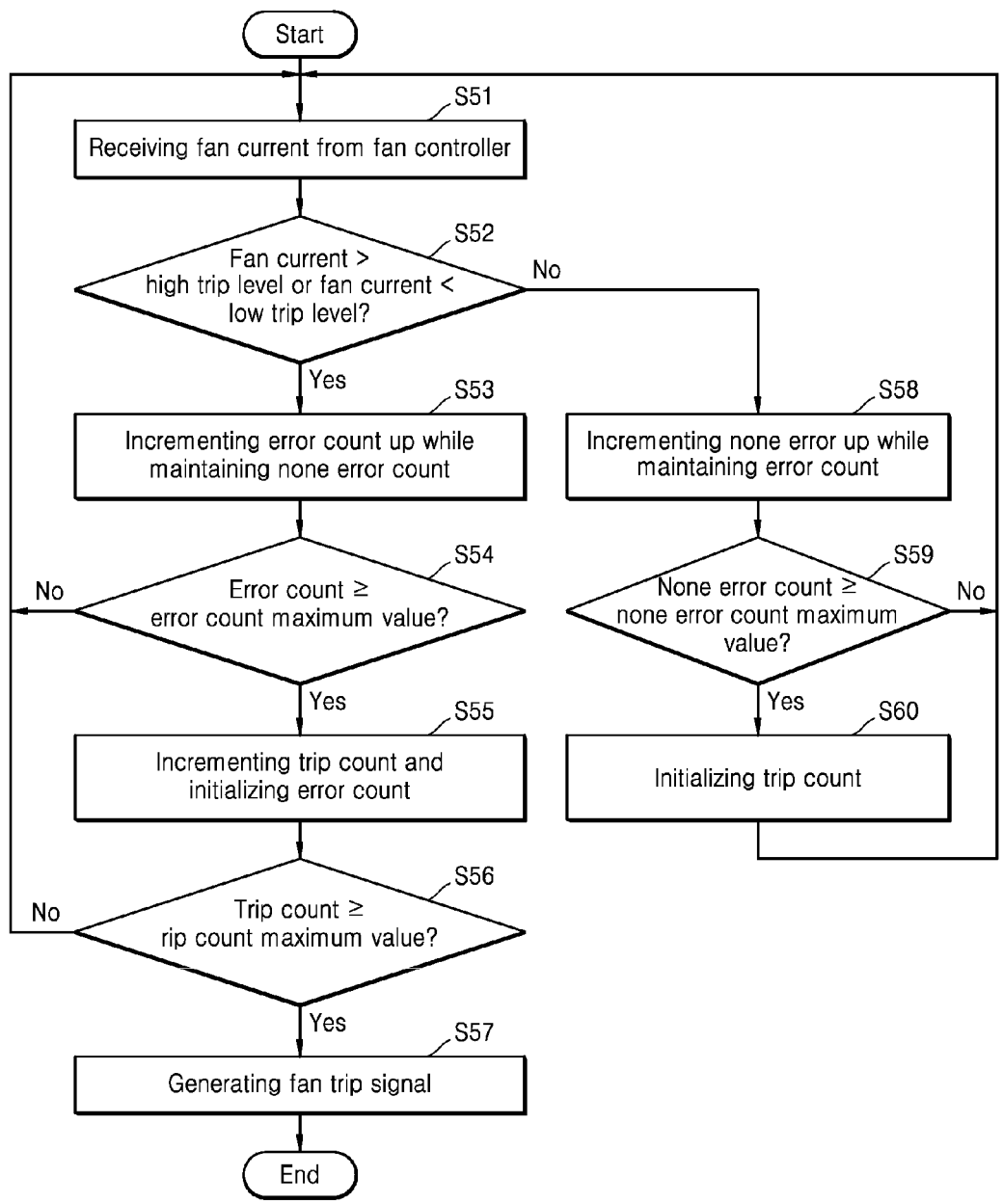
FIG. 5 is a flow chart describing an operation of one embodiment of a controller in the inverter system in accordance with the present disclosure.
Figure 6:
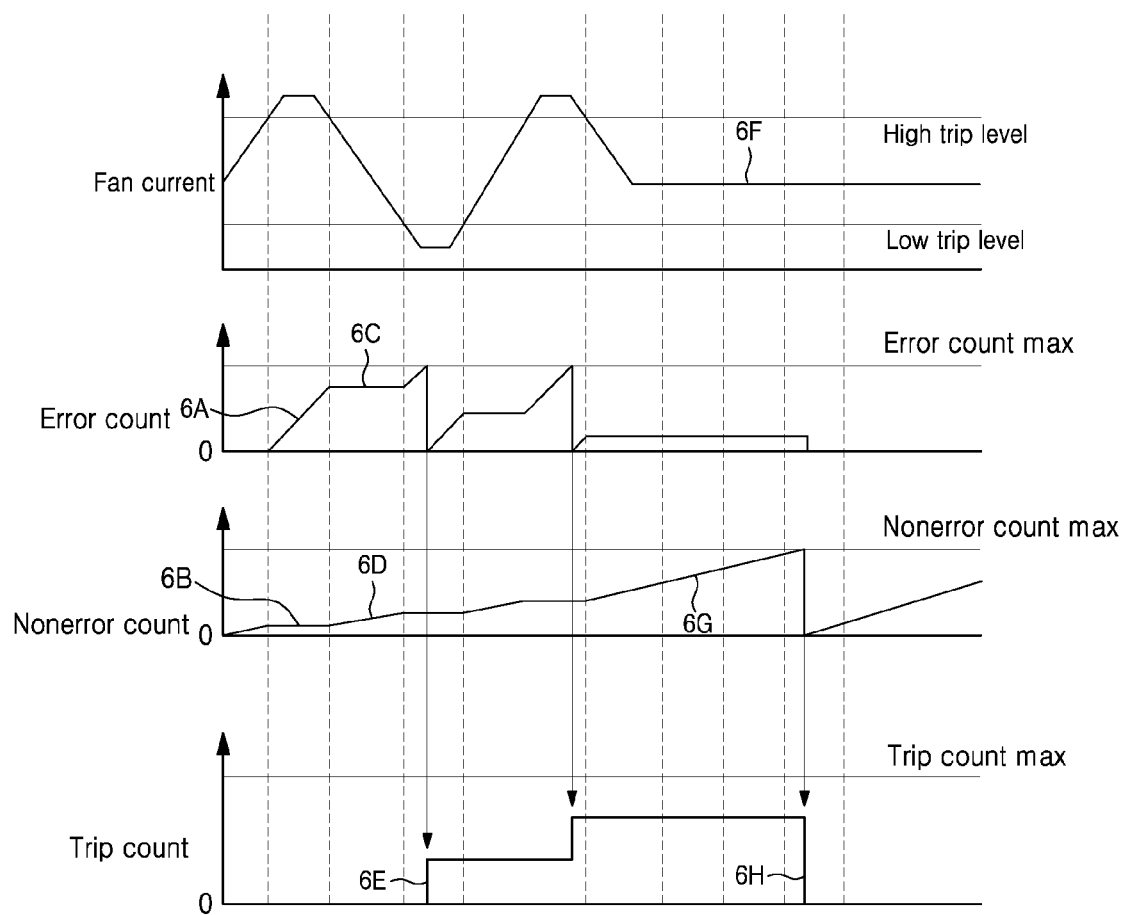
FIG. 6 and FIG. 7 are example diagrams for describing the operation of the controller according to FIG. 5.
Figure 7:
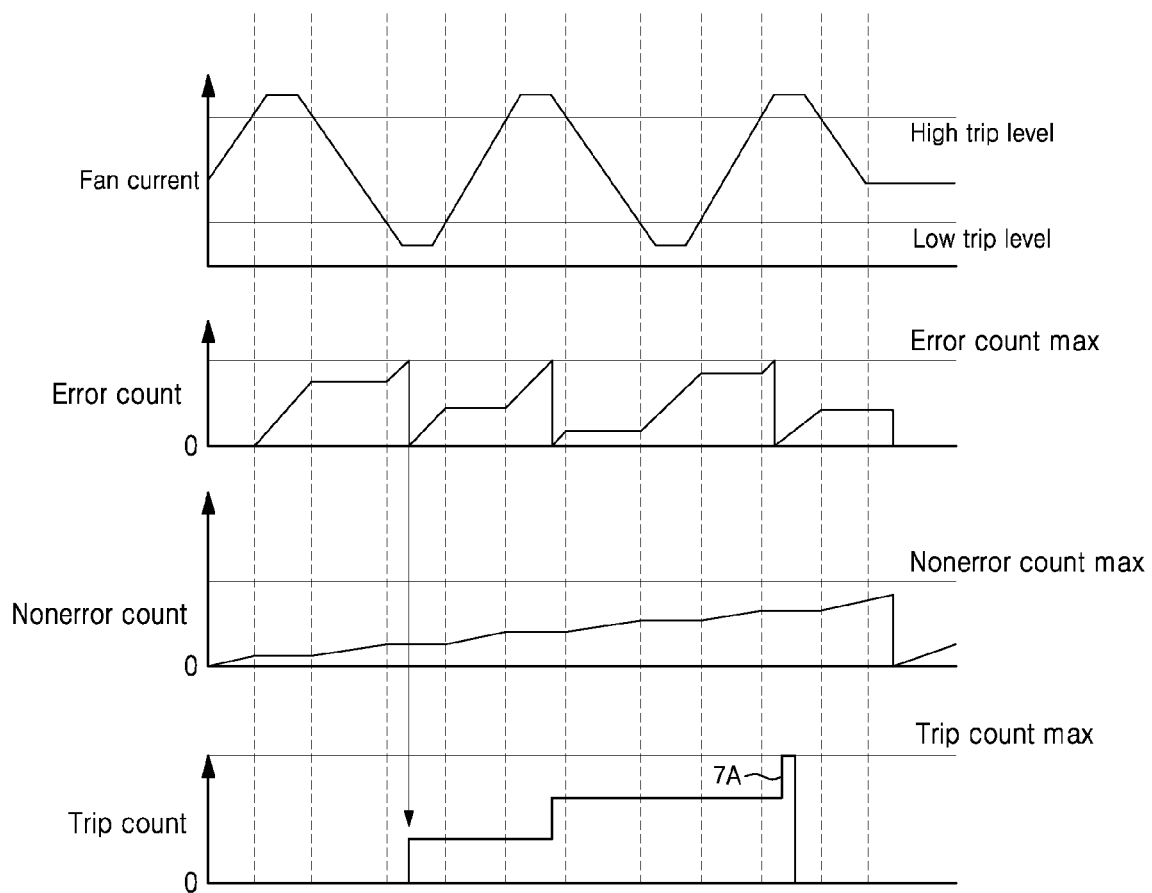

The controller 4 may generate a fan trip based on the fan current I_FAN received from the fan controller 52 and/or the temperature information NCT about the inverter as detected by the temperature detection module. FIG. 5 is a flow chart for describing an example operation of the controller in the inverter system of the present disclosure. FIG. 5 shows the operation of determining whether to generate the fan trip based on the fan current. FIG. 6 and FIG. 7 are example diagrams for describing the operation of the controller according to FIG. 5. FIG. 6 shows a case where no trip occurs, and FIG. 7 shows a case where trip occurs.

Figure 8:
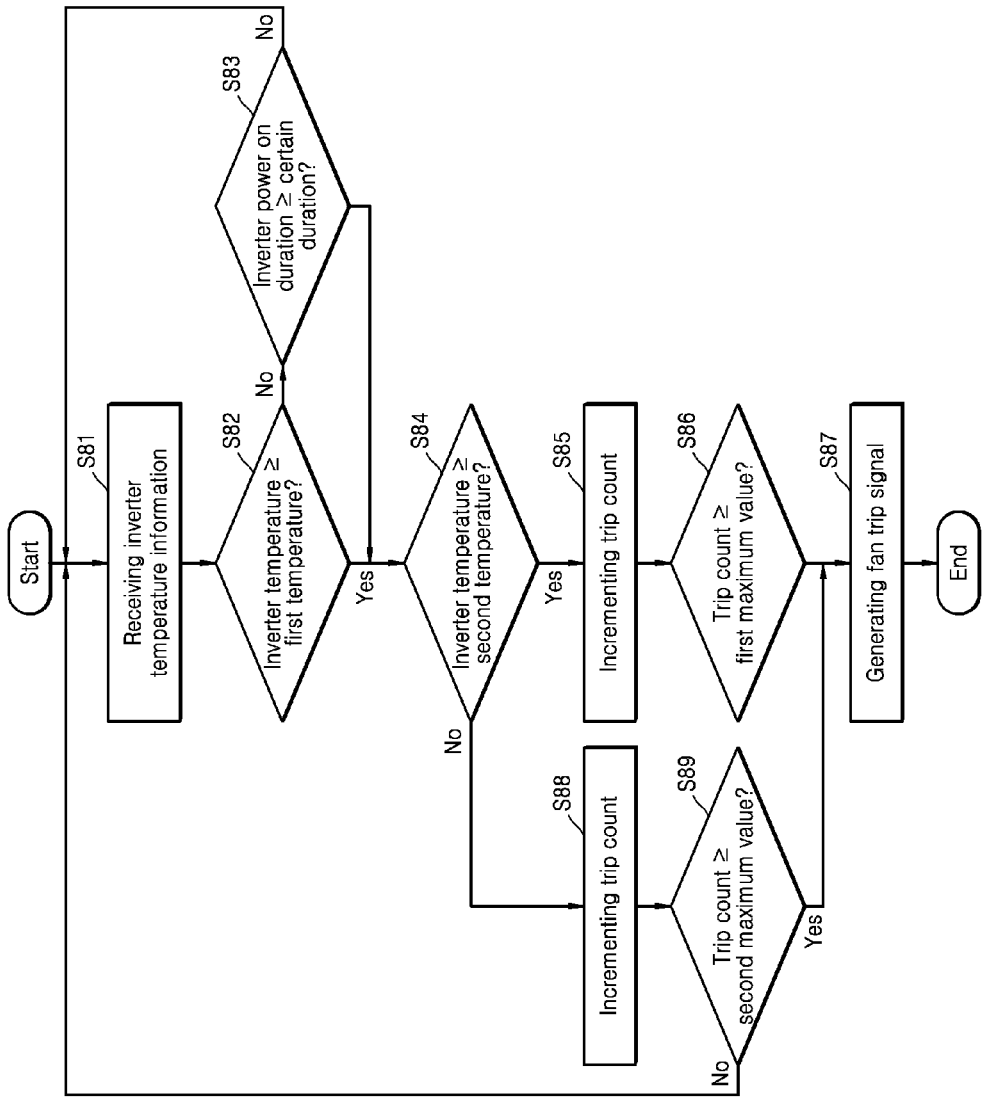
FIG. 8 is a flow chart describing an operation of another embodiment of a controller in the inverter system in accordance with the present disclosure.

Further, FIG. 8 is a flow chart describing an operation of another embodiment of a controller in the inverter system of the present disclosure. FIG. 8 illustrates a determination of whether to generate the fan trip based on the inverter temperature information.

In one embodiment of the present disclosure, the controller determines whether to generate the fan trip primarily based on the fan current, and then determines whether to generate the fan trip secondarily based on the temperature information. Alternatively, the controller 4 may determine whether to generate the fan trip only based on the fan current. Alternatively, the controller 4 may determine whether to generate the fan trip only based on the temperature information.

Referring to FIG. 5, in one embodiment of the present disclosure, the controller 4 may receive a fan current from the fan controller 52 S51. When the fan current exceeds the high trip level or is below the low trip level S52, the controller 4 may increase an error count and maintain a none error count S53.

The increase in the error count lasts until the error count reaches a maximum value MAX. When the error count reaches the error count maximum value MAX, the controller may increase the trip count and initialize the error count at S55. This operation S55 continues until the trip count reaches a maximum value. When the trip count reaches the trip count maximum value MAX S56, the controller 4 may generate a fan trip signal and stop the inverter operation.

In one example, when the fan current is in the normal range between the low trip level and the high trip level, the controller 4 increases the none error count and maintains the error count S58. This operation S58 continues until the none error count reaches the maximum value MAX. When the none error count reaches the maximum value MAX S59, the controller may initialize the trip count, error count and none error count. The trip count, error count, and none error count are initialized when the none error count reaches the maximum value MAX because the controller 4 has determined that the fan normally operates and that there will occur no trip due to the fan current again. This will be described using FIG. 6 and FIG. 7 as follows. FIG. 6 shows a case where no trip occurs, and FIG. 7 shows a case where trip occurs.

Referring to FIG. 6, it may be seen that the fan current is going back and forth between the high trip level and the low trip level, and, then, the fan current has entered the normal range. In this case, conventionally, when the error count reaches the maximum value, a trip occurs immediately.

According to one embodiment of the present disclosure, when the fan current is greater than the high trip level, the error count continues to increase and 6A, while the none error count remains constant. Then, when the fan current enters the normal range (a range of values higher than the low trip level and lower than the high trip level), the error count is maintained 6C, and the none error count is increased 6D. Thereafter, when the fan current goes out of the normal range, the error count increases. Then, when the error count reaches the error count maximum value MAX, the controller may increase the trip count 6E and initialize the error count.

This process is repeated and thus the fan current as output is stable in the normal range. In this case, the none error count continuously increases 6G. Then, when the none error count reaches the maximum value MAX, the trip count is initialized, and the error count and none error count are initialized. As mentioned above, the trip count, error count, and none error count are initialized when the none error count reaches the maximum value MAX because the controller 4 has determined that the fan normally operates.

Thus, according to one embodiment of the present disclosure, the controller does not generate the fan trip signal rapidly even when the fan current is outside the normal range at the beginning of operation, but the fan operates within the normal range after a certain period of time from the beginning, thereby improving the reliability of the inverter. Referring to FIG. 7, unlike the case of FIG. 6, the fan current continues to repeatedly switch into between the normal range and the abnormal range such that the fan current is not maintained in the normal range.

According to one embodiment of the present disclosure, when the fan current is greater than the high trip level, the error count continues to increase, while the none error count is kept constant. Then, when the fan current enters the normal range (a range of values higher than the low trip level and lower than the high trip level), the error count is maintained, while the none error count is incremented. Thereafter, when the fan current goes out of the normal range, the error count increases. When the error count reaches the maximum value MAX, the controller may increase the trip count and initialize the error count. This is described above with reference to FIG. 6.

In FIG. 7, when the error count reaches the maximum value MAX 3 times while the trip count increases 3 times, the trip count reaches the maximum value MAX, thereby to cause a trip 7A. In one embodiment of the present disclosure, an example where the error count and the none error count are maintained or increased according to the fan current even when the trip occurs is illustrated. The present disclosure is not limited thereto. Alternatively, when the trip occurs, both the error count and the none error count may be initialized.

In one embodiment of the present disclosure, an example where the trip occurs when the error count reaches the maximum value MAX three times (the trip count maximum value MAX is 3) is illustrate. The present disclosure is not limited thereto. The trip count MAX may vary depending on the sensitivity of the system.

According to one embodiment of the present disclosure, the controller may use both the inverter temperature information and the fan current to determine whether to generate the fan trip. That is, the controller primarily uses the fan current to determine whether to generate the fan trip. Then, the controller secondarily uses the inverter temperature information to determine whether to generate the fan trip. Alternatively, the controller may use either the fan current or temperature information to determine whether to generate the fan trip. FIG. 8 illustrates how to determine whether to generate the fan trip using the inverter temperature information.

Referring to FIG. 8, the controller 4 may receive the temperature information of the inverter 1 from the temperature detection module 15 S81. Thus, when the temperature does not exceed a set first temperature S82, the controller may also determine whether a certain duration has elapsed since the inverter 1 was powered on S83. When the certain duration has not elapsed since the inverter 1 was powered on, the controller determines this period as an inverter drive transition period. In this connection, the controller is configured to determine whether to cause the fan trip only if the certain duration has elapsed. The certain duration may be, for example, 180 seconds, but is not limited to this. The certain duration may vary depending on how long the transition period is maintained after the inverter 1 is powered on. Further, the set first temperature may be, for example, 10 degrees C. However, it should be understood that the present disclosure is not limited thereto and the first temperature has various values.

When the temperature of the inverter 1 exceeds the first temperature at S82, or when the temperature does not exceed the first temperature at 82, the controller may determine whether the temperature of the inverter 1 is above or equal to a second temperature S84 if the certain duration has elapsed since the power was applied to the inverter 1. In this connection, the second temperature may be, for example, 40° C., but the present disclosure is not limited thereto. The control temperature may vary depending on the environment in which the inverter 1 is used.

When the temperature of the inverter 1 is equal to or higher than the second temperature, the controller 4 may increase the trip count S85. When the trip count exceeds a first maximum value MAX1 S86, the controller may generate a fan trip signal S87.

Alternatively, when the temperature of inverter 1 is below the second temperature, the controller 4 may also increase the trip count S88. Further, when the trip count exceeds a second maximum value MAX S89, the controller may generate a fan trip signal S89.

In one embodiment of the present disclosure, for example, the first maximum value MAX1 of the trip count may be 3. The second maximum value MAX2 of the trip count may be 10. That is, when the temperature of the inverter 1 is higher than or equal to the second temperature 40° C., the trip count maximum value MAX is set to a small number. This indicates an environment in which the inverter 1 may have a great risk if the temperature is higher than or equal to the second temperature. On the other hand, a maximum value MAX applied when the temperature of the inverter 1 is lower than the second temperature 40° C. may be different from that applied when the temperature of the inverter 1 is higher than or equal to the second temperature 40° C. This indicates an environment in which the inverter 1 may have a great risk, thereby to prevent an unnecessary trip.

Thus, according to one embodiment of the present disclosure, the controller may consider the inverter temperature as well as the fan current whether to generate the trip signal. This may improve the reliability of the inverter.

It will be apparent to those skilled in the art that various modifications and variations may be made in the present invention without departing from the spirit of the present disclosure. The technical scope of the present disclosure is not limited to the contents described in the embodiments but should be determined by the claims and equivalents thereof

What is claimed is:

1. A method for controlling an inverter to prevent an unnecessary fan trip, the method comprising:
   receiving a fan current;
   when the fan current is above a high trip level or is below a low trip level, incrementing an error count;
   when the error count reaches an error count maximum value, incrementing a trip count and initializing the error count; and
   when the trip count reaches a trip count maximum value, generating a fan trip signal.

2. The method of claim 1, wherein incrementing the error count includes incrementing the error count up while maintaining a none error count.

3. The method of claim 1, wherein the method further comprises:
   when the fan current is between the low trip level and the high trip level, incrementing the none error count; and
   when the none error count reaches a none error count maximum value, initializing the trip count.

4. The method of claim 3, wherein incrementing the none error count includes incrementing the none error count while maintaining the error count.

5. The method of claim 3, wherein initializing the trip count includes initializing both the error count and the none error count.

6. The method of claim 1, wherein the method further comprises:
   receiving temperature information about a temperature in the inverter;
   when the temperature in the inverter is higher than or equal to a first temperature, incrementing the trip count; and
   when the trip count exceeds a first maximum value, generating a fan trip signal.

7. The method of claim 6, wherein the method further comprises:
   when the temperature in the inverter is lower than the first temperature and is higher than or equal to a second temperature lower than the first temperature, incrementing the trip count; and
   when the trip count exceeds a second maximum value greater than the first maximum value S89, generating a fan trip signal.

* * * * *